United States Patent [19]
Burns et al.

[11] Patent Number: 5,121,069
[45] Date of Patent: Jun. 9, 1992

[54] LOW FREQUENCY SINEWAVE GENERATOR

[75] Inventors: Robert V. Burns; Sanjay Gupta, both of Phoenix, Ariz.

[73] Assignee: Siemens Transmission Systems, Inc., Phoenix, Ariz.

[21] Appl. No.: 285,463

[22] Filed: Dec. 16, 1988

[51] Int. Cl.$^5$ .................. H03B 28/00; H03B 19/00; H03K 5/00

[52] U.S. Cl. ........................ 328/27; 328/14; 328/167; 307/261

[58] Field of Search .......... 328/27, 14, 167; 307/260, 261, 271, 269

[56] References Cited

U.S. PATENT DOCUMENTS

| | | | |
|---|---|---|---|
| 3,579,117 | 5/1971 | Norris et al. | 328/27 |
| 3,838,348 | 9/1974 | Pezzutti | 328/27 |
| 4,192,007 | 3/1980 | Becker | 364/721 |
| 4,317,209 | 2/1982 | Barthelne | 328/27 |
| 4,727,570 | 2/1988 | Tarbouriech | 328/27 |

OTHER PUBLICATIONS

Sandler, H. M. et al.; Sine-Wave Generation Using a High-Order Low-Pass Switched Capacitor Filter; Jun. 5, 1986; Electronic Letters (GB), vol. 22, No. 12; pp. 635-6.

Threlfall, D. C.; Sine Wave Generator Uses Switched Capacitor Filter; May 27, 1982, Electronic Engineering (GB), vol. 54, No. 655; p. 27.

Helfrick, A. D.; Sine Generator Has Low Distortion; Jan. 26, 1984, EDN, vol. 29, No. 2: p. 211.

Wagdy, M. F.; A Microcomputer Controlled Digital Frequency Synthesizer; Mar. 25-27, 1986; IEEE MTC/86 Conference Record; pp. 236-238.

Primary Examiner—Timothy P. Callahan
Attorney, Agent, or Firm—Jeffrey P. Morris

[57] ABSTRACT

A programmable signal generator is disclosed which includes a source of a user control signal. A controlled clock signal generator produces one of a predetermined setof respective clock signals responsive to the user control signal. Means are coupled to the clock signal generator for converting the clock signals to an analog sine-wave.

9 Claims, 1 Drawing Sheet

LOW FREQUENCY SINEWAVE GENERATOR

The present invention relates to a low frequency sinewave generator which may be used in a ring signal generator in a central office of a telephone system or in any other application requiring a low level programmable sinewave signal.

In order to ring a telephone instrument at a subscriber location, it is necessary for the central office to supply a relatively high voltage, low frequency analog sine wave signal to the instrument.

TABLE I

| Frequency (Hz) | Output Voltage (Vrms) |
|---|---|
| 16⅔, 20 | 90 |
| 25, 30 | 100 |
| 33⅓, 40, 42 | 115 |
| 50, 54 | 130 |
| 60, 66, 66⅔ | 140 |

Table I lists the frequencies and the corresponding voltage levels of typical ring signals in the United States. In general, ring signal generators convert a DC supply voltage into the desired low frequency, high voltage sine wave signal in two steps. First, a low power analog sine wave signal having the desired frequency is generated. Second, the low power analog sine wave signal is supplied to a power amplifier which produces the ring signal having the voltage level appropriate to the frequency, as given in Table I above.

Present ring signal generators use known oscillator circuits, such as Wein-Bridge Oscillators, to generate a selected one of the low power sine wave signals. The frequency of the selected sine wave signal is adjusted, for example, by a potentiometer. This requires test equipment to insure correct adjustment of the frequency. Such ringing generators, thus, generally are preset in a manufacturing environment and then sent to the remote sites for installation. It is sometimes desired, however, to change the settings at the remote sites. Test equipment is then needed to correctly readjust the frequency of the generators. In addition, the characteristic values of the components used in such oscillators drift over the lifetime of the oscillators causing the frequency and amplitude of the low power sine wave signal to drift.

Other ring signal generators utilize a microprocessor to generate the low power sine wave. Digitized samples representing a sine wave are stored in the microprocessor memory. The digitized samples are retrieved at an appropriate rate to form a sample stream representing a sine wave of the desired frequency. The digitized samples may be supplied to a digital-to-analog (D/A) converter followed by a low pass filter. Alternatively, the digitized samples may be supplied directly to a pulse width modulated (PWM) power amplifier. The frequency of the sine wave may be controlled by means of a user control. Microprocessor circuitry is complex, and expensive, however, and a D/A converter may be required.

Other oscillators circuits have been constructed using switched capacitor filters to produce low power sine wave signals by filtering square wave signals which are subharmonics of the clock signal used to drive the filter. These oscillators operate on the principle that a square wave consists of a fundamental frequency sine wave component plus odd harmonics of the fundamental. A high-order switched capacitor filter is used to pass the fundamental sine wave component signal and to block the high-order harmonics. Such oscillators, however, either produce a single fixed frequency, or a range of frequencies varying over a four to five decade range, under microprocessor control.

A low frequency sinewave generator is desirable which supplies a low power sine wave signal having one of a desired set of typical frequencies in response to a user control, but without requiring either test equipment to correctly adjust the frequency, or a microprocessor and its associated circuitry and/or a D/A converter.

In accordance with principles of the present invention, a programmable low frequency sinewave generator includes a source of a user control signal. A controlled clock signal generator produces one of a predetermined set of respective clock signals responsive to the user control signal. Means are coupled to the clock signal generator, for converting the clock signals to an analog sine-wave.

In an illustrated embodiment, the low frequency sine wave is generated using analog circuitry. This technique eliminates the need for a microprocessor and/or a D/A converter. The illustrated embodiment also uses a rotary switch to select the desired standard ring signal, which is automatically generated having the correct frequency and amplitude. This eliminates the need for test equipment when the signal generator is being reconfigured to a new signal frequency.

Figure 1:
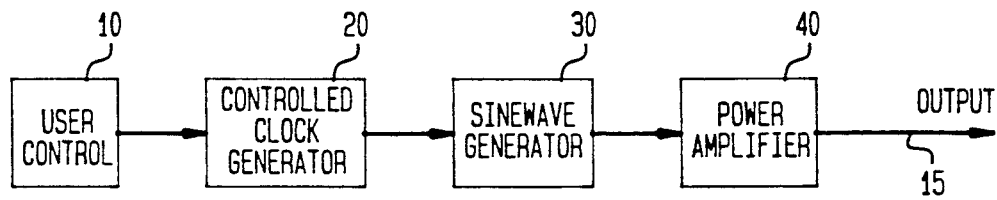
FIG. 1 is a block diagram of a ring signal generator in accordance with the present invention.

In FIG. 1, a user control circuit 10 produces a user control signal. The user control signal is supplied to an input terminal of a controlled clock signal generator 20. An output terminal of the controlled clock signal generator 20 is coupled to an input terminal of an analog sine wave generator 30. An output terminal of the analog sine wave generator 30 is coupled to an input terminal of a power amplifier 40. An output terminal of the power amplifier 40 is coupled to an output terminal 15 of the ring signal generator and produces the desired ring signal. Output terminal 15 is coupled to utilization circuitry (not shown) for supplying ring signal to a subscriber telephone line when it is desired to ring the instrument connected to the subscriber line.

In operation, the user control circuitry 10 produces one of a predetermined set of user control signals, each member of the set corresponding to one of the set of standard ring signals, such as are given in Table I above. For example, the user control circuitry 10 may include a rotary switch. There are 12 frequencies listed in Table I above. The rotary switch may be a single pole, 12 throw switch in which the pole is connected to ground. The 12 terminals of the rotary switch may each be connected to an operating voltage source through a resistor (i.e. pulled up) and to the controlled clock signal generator 20. The terminal of the rotary switch corresponding to the selected frequency signal, thus, will be at ground voltage, and the remaining terminals will be at the operating voltage. In this example, the user control signal is the combination of the signals at the 12 terminals of the rotary switch.

The user control signal conditions the controlled clock signal generator 20 to produce clock signals having frequencies related to the frequency of the desired low power sine wave signal. In response to the clock signals produced by the controlled clock signal generator 20, the analog sine wave generator 30 produces a sine wave having the desired frequency and an amplitude which is related to the voltage of the desired ring signal. The controlled clock signal generator 20 and the analog sine wave generator 30 are described in more detail below.

Power amplifier 40 amplifies the analog sine wave signal from the analog sine wave generator 30 to produce the ring signal having the desired frequency and voltage. The power amplifier 40 may, for example, be a pulse width modulated (PWM) amplifier of a known type. U.S. Pat. No. 4,399,499 issued Aug. 16, 1983 to Butcher et al. illustrates an example of a PWM power amplifier which may be used in the ring signal generator illustrated in FIG. 1. In the present illustrated embodiment, the power amplifier amplifies the analog sine wave signal by a fixed factor. In order to supply a signal having the correct voltage, therefore, the amplitude of the analog sine wave signal is adjusted to have the appropriate value. Alternatively, the amplitude of the sine wave signal may be fixed and the amplification factor of the power amplifier 40 controlled to produce the ring signal having the appropriate voltage.

Figure 2:
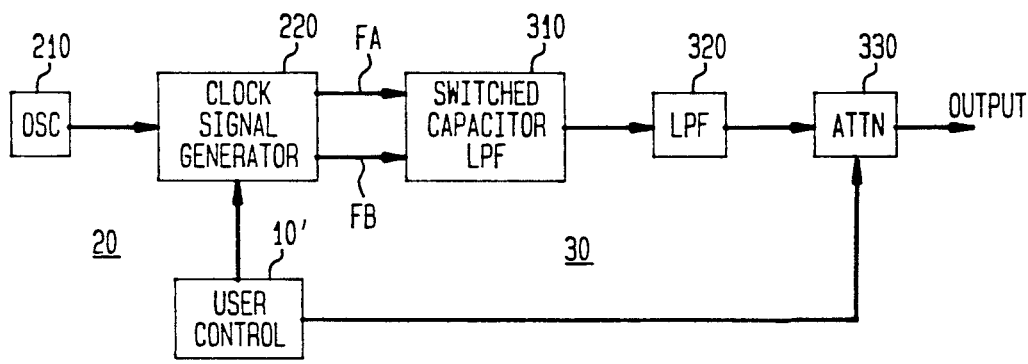
FIG. 2 is a block diagram of a low frequency sine wave generator according to the invention which may be used in the ring signal generator illustrated in FIG. 1.

FIG. 2 is a block diagram of a controlled clock signal generator and sine wave generator which may be used in the ring signal generator illustrated in FIG. 1. In FIG. 2 a master clock signal oscillator 210 is coupled to an input terminal of a clock signal generator 220. Clock signal generator 220 produces two clock signals FA and FB. Master oscillator 210 and clock signal generator 220, in combination, form the controlled clock signal generator 20 (of FIG. 1).

Clock signals FA and FB are coupled to respective input terminals of a switched capacitor low pass filter (LPF) 310. An output terminal of switched capacitor LPF 310 is coupled to an input terminal of a low pass filter (LPF) 320. An output terminal the LPF 320 is coupled to an input terminal of a controllable attenuator ATTN 330. An output terminal of the controllable attenuator 330 is coupled to the power amplifier 40 (of FIG. 1). Switched capacitor LPF 310, LPF 320 and controllable attenuator 330, in combination, form the analog sine wave generator 30 (of FIG. 1). User control circuit 10' is coupled to respective control input terminals of the clock signal generator 220 and the variable attenuator 330.

In operation, the analog sine wave generator 30 operates on the principle that a square wave is composed of a fundamental sine wave component (having the frequency of the square wave) and higher order odd harmonics of the fundamental. The switched capacitor LPF passes the fundamental frequency and blocks the frequencies of the higher order odd harmonics. The output of the switched capacitor LPF is thus a sine wave at the fundamental frequency. LPF 320 eliminates the switching frequencies present in the output signal of the switched capacitor LPF 310. LPF 320 may, for example, be an active low pass filter of the Sallen-Key type.

The clock signal generator divides the master oscillator signal to produce a first clock signal FA which controls the switching of the switched capacitor LPF 310. It is the frequency of this signal which controls the cutoff frequency of the switched capacitor LPF 310. The clock signal generator also divides the master oscillator signal to produce a second clock signal FB which has a frequency which is close in frequency to the frequency of one of the standard ring signals, as given in Table I, above. This signal is supplied to the input terminal of the switched capacitor LPF 310. The clock signal generator 220 is described in more detail below.

The switched capacitor LPF 310 is, preferably a higher order filter to better suppress the higher order odd harmonics present in the input square wave signal. The MF6-50 6th Order Switched Capacitor Butterworth Lowpass Filter manufactured by National Semiconductor Corporation may be used as the switched capacitor LPF 310.

The variable attenuator 330 may, for example, be a multitap voltage divider with a controlled switch coupled to the respective taps. If the power amplifier 40 (of FIG. 1) is arranged to amplify by a fixed factor of 100, for example, then a first tap of the voltage divider maybe arranged so that it produces a signal having an rms ac voltage of 0.9 volts; a second produces a signal having an rms ac voltage of 1.0 volt; a third 1.15 volts, a fourth 1.3 volts and a fifth 1.4 volts. The particular tap coupled by the controlled switch to the output terminal of the variable attenuator 330 is selected according to Table I in response to the user control signal.

Figure 3:
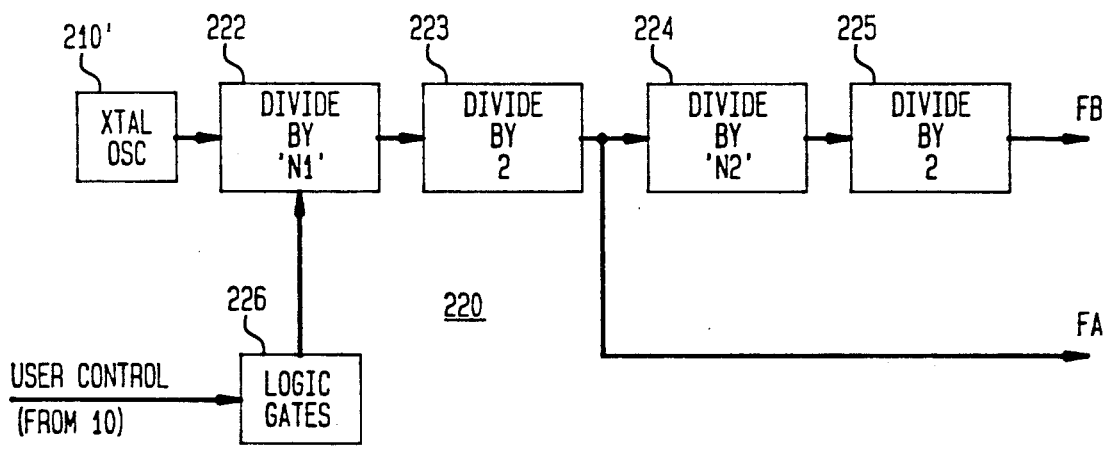
FIG. 3 is a block diagram of a clock signal generator which may be used in the low frequency sine wave generator illustrated in FIG. 2.

FIG. 3 is a block diagram of a clock signal generator 220 which may be used in the controlled clock signal generator 20 (of FIG. 2). In FIG. 3, a crystal oscillator 210' has an output terminal coupled to an input terminal of a divide-by-'N1' circuit 222. An output terminal of the divide-by-'N1' circuit is coupled to an input terminal of a divide-by-2 circuit 223. An output terminal of the divide-by-2 circuit 223 is coupled to an FA signal output terminal and an input terminal of a divide-by-'N2' circuit 224. An output terminal of the divide-by-'N2' circuit is coupled to an input terminal of a divide-by-2 circuit 225. An output terminal of the divide-by-2 circuit 225 is coupled to an FB signal output terminal. The user control signal from user control circuit 10 is coupled to an input terminal of logic gates 226. An output terminal of the logic gates 226 is coupled to an input terminal of the divide-by-'N1' circuit.

In operation, the combination of the crystal oscillator 210', the divide-by-'N1' circuit 222, the divide-by-2 circuit 223 and the logic gates 226 produces the clock signal FA for the switched capacitor filter. For example, crystal oscillator 210' may be a standard digital crystal oscillator producing a square wave signal having a frequency of 1.024 MHz.

The divide-by-'N1' circuit may consist of a plurality of 74LS192 Presettable 4-bit Decade Up/Down Counters, manufactured by Signetics Corporation, and cascaded in a known manner. Such a configuration may divide the frequency of an input clock signal by a factor N by producing a single pulse, lasting for a single clock pulse period, every N clock periods. The divide-by-2 circuit 223 may be a flip-flop which produces a square wave having a 50% duty cycle. The divide-by-'N2' circuit 224 is a fixed divider which, for example, produces an output pulse once for every 32 input pulses. Divide-by-2 circuit 225 may be a flip flop which produces a clock signal FB which is a square wave signal having a 50% duty cycle. This signal is the input signal for the switched capacitor filter 310 (of FIG. 2). The combination of divide-by-'N2' circuit 224 and divide-by-2 circuit 225 divides clock signal FA by a fixed factor of 64.

The desired factor 'N1' for each of the standard ring signal frequencies given in Table I above is given in Table II.

TABLE II

| Desired Frequency (Hz) | Required N1 | Nearest Integer | Actual F (Hz) | % Dev |
|---|---|---|---|---|
| 16 | 500.00 | 500 | 16.00 | — |
| 16⅔ | 479.99 | 480 | 16.67 | — |
| 20 | 400.00 | 400 | 20.00 | — |
| 25 | 320.00 | 320 | 25.00 | — |
| 30 | 266.67 | 267 | 29.96 | 0.13 |
| 33⅓ | 240.00 | 240 | 33.33 | — |
| 40 | 200.00 | 200 | 40.00 | — |
| 42 | 190.47 | 190 | 42.11 | 0.26 |
| 50 | 160.00 | 160 | 50.00 | — |
| 54 | 148.15 | 148 | 54.05 | 0.09 |
| 60 | 133.33 | 133 | 60.15 | 0.25 |
| 66 | 121.12 | 121 | 66.12 | 0.18 |
| 66⅔ | 120.00 | 120 | 66.67 | — |

Table II shows the frequencies of the typical ring signals in the first column. The second column indicates the required 'N1' factor for the clock signal generator of FIG. 3 to develop a square wave having the frequency in the first column as clock signal FA, assuming a master clock frequency of 1.024 MHz, and a fixed divide factor of 128 (a factor of 2 by divide-by-2 circuit 223, and a factor of 64 by the combination of divide-by-'N2' circuit 224 and divide-by-2 circuit 225). The third column contains the closest integer to the desired factor in the second column. The fourth column is the actual frequency of a square wave developed as clock signal FA by the clock signal generator of FIG. 3 dividing by the factor in the third column. The fifth column is the percent deviation of the actual frequency in the fourth column from the desired frequency in the first column. In the illustrated embodiment, the deviations are acceptably small.

Logic gates 226 may consist of combinatorial logic which will produce the appropriate signal to condition the divide-by-'N1' circuit 222 to divide by the correct factor (as given in Table II) in response to the user control signal from user control circuit 10. Alternatively, the logic gates 226 may be a read only memory (ROM) with the correct logic signals corresponding to one of the standard ring signal frequencies preprogrammed into respective locations. The address input terminal of the ROM is then coupled to receive the user control signal.

Using the MF6-50 switched capacitor filter, described above, the ratio of the frequencies of the clock signal FA (from divide-by-2 circuit 223) and the input signal FB (from the divide-by-2 circuit 225) causes the third harmonic of the input square wave to be attenuated by 44.41 db.

For example, if a 20 Hz ringing signal is desired, the rotary switch is set to this setting. The logic gates 226 are conditioned, in response to this signal, to provide a signal to the divide-by-'N1' circuit 222 which conditions the divide-by-'N1' circuit 222 to divide by a factor 'N1' of 400 (as shown in Table II.) The clock signal at the output of the divide-by-'N1' circuit 222 is, thus, 2.56 kHz. The output of the divide-by-2 circuit 223 (clock signal FA) is, thus, 1.28 kHz. The combination of divide-by-'N2' circuit 224 and the divide-by-2 circuit 225 divide the clock signal FA by 64. This results in a clock signal FB which is a square wave signal having a frequency of 20 Hz. This signal is filtered by the switched capacitor filter 310 (of FIG. 2) to produce an analog sine wave signal having its third harmonic attenuated by approximately 44 db. This analog sine wave is then passed through the variable attenuator 330 which is conditioned to produce an analog sine wave signal having an rms voltage of 0.9 volts. This signal is then amplified by a factor of e.g. 100 in the power amplifier 40 (of FIG. 1) to produce the ringing signal which is an analog sine wave having a frequency of 20 Hz and an rms voltage of 90 volts.

What we claim is:

1. A low frequency sinewave generator for producing a sinewave signal having one of a predetermined set of frequencies, comprising:
    a source of a user control signal;
    a source of a master oscillator signal;
    a controlled clock signal generator for producing one of a predetermined set of respective clock signals, respectively corresponding to said predetermined set of frequencies, responsive to said user control signal and said master oscillator signal;
    means, coupled to said clock signal generator, for converting said clock signals to an analog sinewave
    a controllable attenuator having an input terminal coupled to said means for converting said clock signals to an analog sine wave, and a control terminal coupled to said source of user control signal, for producing a signal having one of a predetermined set of amplitudes, corresponding to said one of said predetermined set of frequencies, and selected in response to said user control signal.

2. The generator of claim 1, wherein said user control signal source produces a signal having a selected one of a predetermined number of states respectively corresponding to a selected one of said clock signals in said predetermined set of respective clock signals.

3. The generator of claim 1 wherein said source of a user control signal comprises a switch for providing a control signal according to a selected one of said predetermined set of respective clock signals.

4. The generator of claim 1, wherein:
    said controlled clock signal generator produces a first and a second clock signal responsive to said user control signal with said first clock signal indicative of said one of said predetermined set of clock frequencies and said second clock signal being a filter control signal of a different frequency than said first clock signal;
    said means for converting said clock signals to an analog sine wave comprises a switched capacitor filter responsive to said first and second clock signals;
    wherein the frequency of said analog sine-wave depends upon the frequency of said first clock signal with said second clock signal controlling the switching of said capacitor filter.

5. The generator of claim 1 wherein said controlled clock signal generator comprises:
    first means, coupled to said source of a master oscillator signal, for producing a first clock signal having a frequency selectable in response to said user control signal; and second means, coupled to said master oscillator, for producing a second clock signal having a frequency which is the frequency of said first clock signal divided by a fixed factor.

6. The controller of claim 5 wherein said first clock signal producing means comprises:
a controllable frequency divider, having an input terminal coupled to said master oscillator, a control input terminal, and an output terminal, for producing a signal having a frequency selected in response to the signal at said control input terminal; and
means, coupled between said user control signal source and said control input terminal of said controllable frequency divider, for selecting the division factor of said controllable frequency divider.

7. The controller of claim 6, wherein said first clock signal producing means further comprises means, coupled to said output terminal of said controllable frequency divider, for producing a square wave having a 50% duty cycle.

8. The controller of claim 5 wherein said second clock signal producing means comprises a fixed frequency divider, having an input terminal coupled to said first clock signal producing means, and an output terminal.

9. The controller of claim 8, wherein said second clock signal producing means further comprises means, coupled to said output terminal of said fixed frequency divider, for producing a square wave having a 50% duty cycle.

* * * * *